United States Patent [19]

Jacomb-Hood

[11] Patent Number: 4,806,944
[45] Date of Patent: Feb. 21, 1989

[54] SWITCHABLE MATCHING NETWORK FOR AN ELEMENT OF A STEERABLE ANTENNA ARRAY

[75] Inventor: Anthony W. Jacomb-Hood, Liverpool, N.Y.

[73] Assignee: General Electric Company, Syracuse, N.Y.

[21] Appl. No.: 95,927

[22] Filed: Sep. 14, 1987

[51] Int. Cl.[4] .............................................. H01Q 3/00
[52] U.S. Cl. ...................... 343/745; 343/777
[58] Field of Search ............... 343/700 MS, 745, 749, 343/750, 777, 778, 798, 820, 822, 850, 852; 333/138; 342/371

[56] References Cited

U.S. PATENT DOCUMENTS

| | | | |
|---|---|---|---|
| 3,129,386 | 4/1964 | Daly | 343/852 |
| 4,564,843 | 1/1986 | Cooper | 343/745 |
| 4,656,483 | 4/1987 | Jaquet | 343/745 |

Primary Examiner—William L. Sikes
Assistant Examiner—Doris J. Johnson
Attorney, Agent, or Firm—Richard V. Lang; Carl W. Baker; Fred Jacob

[57] ABSTRACT

The invention relates to a matching network which may be serially inserted in the path between a transmitter power amplifier and/or a receiver low noise amplifier and an element of a steerable array antenna to compensate for mismatching occurring when the antenna is steered away from bore sight or tuned to off resonant frequencies. The invention permits computer controlled digital setting of the matching network in accordance with the known impedance characteristics of the antenna element, to restore VSWRs which in an exemplary case may have a maximum design value of 3.0 when uncompensated to a VSWR of 1.6 with a simple matching network, or to a VSWR of 1.22 with a more highly corrected matching network.

13 Claims, 9 Drawing Sheets

VSWR AT 10.2 GHz WITH THE
BEAM SCANNED HORIZONTALLY

VSWR AT 10.2 GHz WITH THE
BEAM SCANNED VERTICALLY

VSWR AT 9.2 GHz WITH THE BEAM SCANNED HORIZONTALLY

VSWR AT 9.2 GHz WITH THE BEAM SCANNED VERTICALLY

INSERTION LOSS AT 10.2 GHz WITH THE BEAM SCANNED HORIZONTALLY

INSERTION LOSS AT 10.2 GHz WITH THE BEAM SCANNED VERTICALLY

INSERTION LOSS AT 9.2 GHz WITH THE BEAM SCANNED HORIZONTALLY

INSERTION LOSS AT 9.2 GHz WITH THE BEAM SCANNED VERTICALLY

ADMITTANCE COORDINATES

RADIALLY SCALED PARAMETERS

ADMITTANCE COORDINATES

RADIALLY SCALED PARAMETERS

SWITCHABLE MATCHING NETWORK FOR AN ELEMENT OF A STEERABLE ANTENNA ARRAY

BACKGROUND OF THE INVENTION

1. Field of the Invention

The invention relates to electronically steered arrays for broadband applications, and more particularly to means for actively matching such arrays as the steering angle or operating frequencies are varied.

2. Description of the Prior Art

Electronically steered arrays or phased arrays as they are also known, are arrays of antenna elements disposed at regular intervals over a surface. Each such array may either be used singly or associated with other arrays. When used with other arrays, a frequent objective is to provide complete azimuthal coverage around the antenna site. In such applications, the steering of each array should be adequate to cover a substantial fraction of the 360° required for complete coverage. Conventionally the steering is plus or minus 60° or plus or minus 45°, which allows for complete azimuthal coverage with three or four arrays.

As is well known, the impedance of each antenna element varies in the complex plane with the steering angle, varying more rapidly at larger steering angles. This effect, which increases the VSWR (Voltage Standing Wave Radio) in the antenna coupling paths, degrades the antenna performance very sinificantly at the higher steering angles, demanding smaller steering angles and more rather than fewer arrays to achieve coverage over a given solid angle.

Impedance matching is not a simple task, since the antenna impedance varies both with steering angle orientation and frequency. The impedance varies in a different manner for steering which occurs parallel from that which occurs perpendicular to the E field of the element. The antenna impedance also varies, usually by rotation in the complex plane, as the freuency of operation is shifted.

In practice, antennas in electronically steered arrays are often required to operate at substantial steering angles both perpendicular and parallel to the E fields of the antenna elements, and often at other than the resonant frequency of the antenna element. Under such conditions of steering and operating frequency, the antenna no longer matches the impedance of the driving circuit in transmission and the receiving circuit isno longer matched to the antenna in reception.

The problem of antenna matching is complicated when the antenna is electronically steered in mutually perpendicular directions, since the complex impedance of the antenna, if mapped in the complex plane, as on a Smith chart, pursues separate, angularly displaced paths. sould the frequency vary as well, the prior paths tend to be rotated. Thus areas of the Smith chart completely encircling the origin represent potential impedance states of the antenna elements. Accordingly, it is desirable to provide a matching network which can provide an acceptable impedance match to any region within a VSWR circle of a given radius in the complex plane.

Since tuning and steering are rapidly adjusted in an electronically steered array, and subject to digital electronic control, it is desirable that thematching be "agile" and adjustable at the same rate as the tuning and steering and subject to digital electronic control.

Finally, since the matching networks must be used with each antenna element of a phased array, large numbers are required. This forces an economy in the design. In addition, in reducing the VSWR's and the usually smaller dissipative losses, it is essential that the matching networks not compound the problem by introducing significant dissipative losses of their own or requiring significant amounts of dc power.

SUMMARY OF THE INVENTION

Accordingly, it is an object of the invention to provide an improved matching network for an element of an electronically steered array.

It is another object of the invention to provide an improved digitally controlled matching network for an element of an electronically steered array.

It is still another object of the invention to provide a digitally controlled network which is capable of matching an element of an antenna array over substantial steering angles and over a substantial range of operating frequencies.

It is an additional object of the invention to provide a digitally controlled matching network which is capable of matching an element of an electronically steered array to a given smaller VSWR (Voltage Standing Wave Radio) not exceeding the original unmatched VSWR.

It is an object of the invention to provide a digitally controlled matching network for an element of an electronically steered array, which introduces minimum attenuation loss and absorbs minimum dc power These and other objects of the invention are achieved in accordance with the invention in an antenna system by a noval combination, comprising an electronically steerable array, comprising an n-fold plurality of like antenna elements, an n-fold plurality of like, switchable matching networks, and control means set in accordance with the frequency and/or beam steering angle for effecting control of each matching network.

Further in accordance with the invention, each matching network is serially connected between a transmitter element and/or a receiver element at one connection point and a corresponding antenna element at the other connection point and provides a bidirectional transmission path between said connection points.

Each matching network comprises a plurality of serially connected transmission line elements with a serial and a shunt portion and has a characteristic impedance matched to the system impedance. Successive transmission line elements each produce a delay which accumulates stepwise as a function of serial position in the matching network.

The shunt portion of each transmission line element comprises a switchable reactance element, which in one (the off) state preserves the characteristic impedance, and in the other (the on) state introduces a reactive mismatch comparable to that introduced by the antenna element when frequency and/or beam steering angle is varied.

The control means switches one reactance element to the one state in a selected ($i^{th}$) transmission line element in each of the n-fold switchable matching networks to produce a reactive mismatch at a phase shift selected to offset the antenna mismatch and transform the antenna impedance to a value approximating the system impedance in each element of the steerable array.

Further in accordance with the invention, certain of the shunt paths may provide four impedance states, achieved by employing a series of four inductances and three switching PI diodes. Selection of which diode is on is then used to remove successive numbers of inductances to achieve the four states.

In accordance with a further aspect of the invention, the shunt paths may use one or two capacitors switched with PIN diodes. Those shunt paths having a pair of capacitors of appropriately scaled values, connected mutually in parallel, may also provide four impedance states.

In the simpler designs, matching from VSWRs of 3.0 to 1.6 may be achieved, while in the more complex designs, matching from VSWRs of 3.0 to 1.22 may be achieved.

DESCRIPTION OF THE DRAWINGS

The invention and distinctive features of the invention are set forth in the claims of the present application. The invention itself, however, together withfurther objects and advantages thereof may best be understood by reference to the following description and accompanying drawings, in which:

DESCRIPTION OF THE PREFERRED EMBODIMENT

Figure 1:
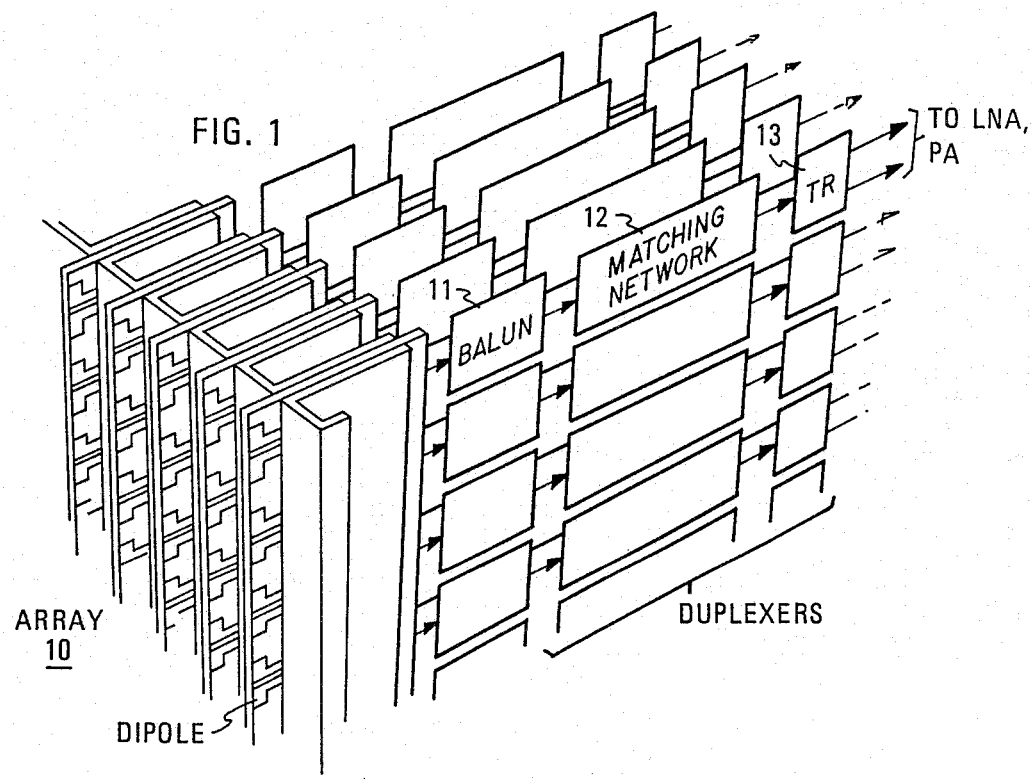
FIG. 1 is a perspective view of a portion of a high performance antenna system in accordance with the invention comprising a scanned array, each element of which is coupled to a balun and a plurality of novel duplexers, each including a novel switchable matching network and a TR device, and being arranged to couple individual dipole elements of the array to the transmitter and receiver circuitry.

Referring now to FIG. 1, a portion of an antenna system in which the invention finds application is illustrated. The illustrated system includes an electronically steerable array 10 of dipole antenna elements, and an equal number of associated circuits for performing the functions essential to delivering an optimum signal from each antenna element to a low noise amplifier (LNA) during reception and for providing means to efficiently couple the output from a power amplifier (PA) to each antenna element during transmission.

The functions essential to optimum coupling between each antenna element and the associated LNA, and between eachPA and the associated antenna element are performed in three blocks 11, 12, and 13 replicated for each antenna element. The first block denotes a balun 11, which couples the "balanced" antenna to an unbalanced transmission line to the blocks 12 and 13, which are conventionally fabricated using unbalanced microstrip transmission paths.

Collectively, the two blocks 12 and 13 form a duplexer. During reception their function isto delivery the signal received by a given antenna element with minimum attenuation and with minimum reflection (i.e. a low VSWR) to the receiving (LNA) port and with minimum diversion to the transmitting (PA) port. During transmission the function of the duplexer is to deliver the transmitted signal to the antenna element with minimum attenuation and with minimum reflection (i.e. a low VSWR) to the transmitting (PA) port and with minimum diversion to the receiver (LNA) port.

More particularly, the duplexers each consist of a novel switchable matching network is serially connected between a transmitter port and/or a receiver port at one connection point and a corresponding antenna element at the other connection point. Due to a natural law of reciprocity, if one designs the illustrated portion of the antenna system to have the same impedances at the transmitter port and receiver port, the same matching requirement will be present in either transmission or reception. Under these circumstances, the same matching network may be used during transmission or reception provided, or course,that it is bidirectional, allowing signals to flow from the first connection point to the second connection point, or vice versa as is customarily true of a transmission line.

The duplexer is completed by a block 13 denoted a TR circuit which, dependent on the state of the system and a suitable control signal, routes the signal fom antenna to low noise amplifier or from power amplifier to antenna with a minimum of the earlier mentioned undesired diversions. Both the path during reception and during transmission are taken through the common switchable matching network.

The switchable matching network is a novel portion of the duplexer which is designed to minimize attenuation and reflection in the two paths described above, and to facilitate the transmit/receive (T/R) function. The switchable matching networks 12 have been introduced to sustain high antenna system performance through a range of steering angles departing substantially from the "bore sight" and a range of operating frequencies.

The computed performance of an exemplary steerable antenna system is depicted in FIGS. 2A–2H. The "VSWR" and attenuation loss are graphed as a function of steering angle at two operating frequencies. The first group of graphs (FIGS. 2A–2D) depict the VSWR performance as a function of beam angle with and without compensation, at 10.2 GHz and a 9.2 GHz. The second group fo graphs (FIGS. 2E–2H) depict the insertion loss as a function of beam angle with compensation against a comparable steerable antenna system using a circulator at the same two frequencies (i.e. 10.2 GHz and 9.2 GHz).

Figure 2A:
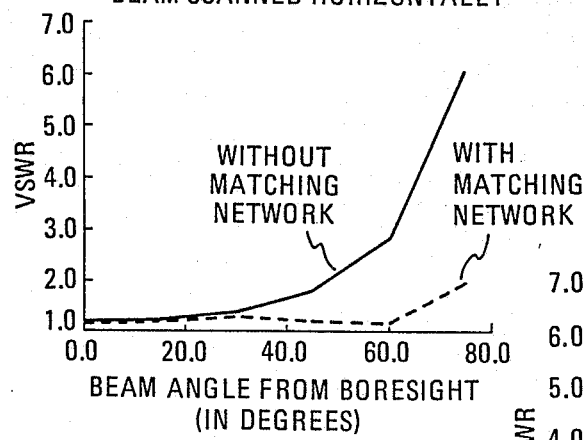
FIGS. 2A through 2H are a series of graphs depicting the improvement in performance achievable through use of the novel switchable matching network, FIGS. 2A through 2D illustrating the VSWR performance with and without the matching network with variation in beam steering angle at two operating frequencies and FIGS. 2E through 2H illustrating the insertion loss with and without the matching network with variation in beam steering angle at two operating frequencies.

More particularly, FIG. 2A graphs the VSWR of a steerable array as the angle of the horizontally scanned beam increases to 75° from bore sight. The graph with the E-plane of the individual antenna elements vertical, and the antenna being operated at 10.2 GHz. The solid line depicts the VSWR of the steerable array without a matching network. At about 30° from the bore sight, the VSWR begins to increase, reaching about 1.8 at 45° and then increasing more steeply, reaching a value of 3.0 at 60°. From 60° to 75° the VSWR increases from 3.0 to 6.0. Without the matching network, performance is seriously degraded from about 30° on and operation beyond 60° is substantially ruled out. The same antenna system operating with a matching network, in accordanc with the invention, exhibits the much improved VSWR performance illustrated by the dashed line. The VSWR remains below about 1.3 until horizontally scanned 60° from bore sight and then climbs to about 2 at 75°. From this it may be seen that with the indicated compensating network, undegraded performance can be achieved to a horizontal scanning angle of about 60°, and if a VSWR of approximately 2 is tolerable, horizontal scanning to about 75° may be employed.

Figure 2B:
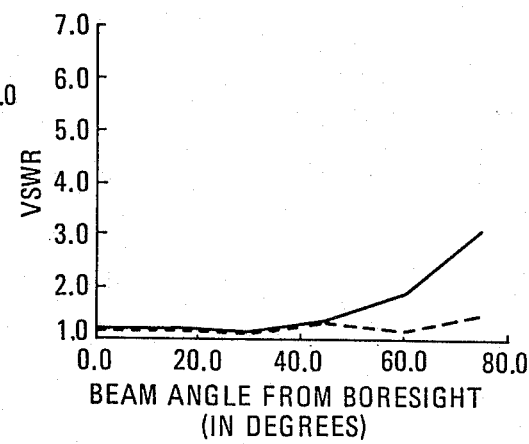

FIG. 2B is a graph of the VSWR of the same steerable array while vertically scanned. The beam is vertically scanned to 75° from bore sight, the E-plane is vertical and the antenna is operated at 10.2 GHz as before. The solid line, depicting the VSWR of the steerable array without a matching network climbs less rapidly with vertical scanning then with horizontal scanning. At 45° the VSWR (without a matching network) is about 1.4 and increases to about 2 at 60°. At 75° the VSWR is slightly above 3. The same antenna system operating with a matching network exhibits the VSWR performance illustrated by the dashed line. The VSWR remains below about 1.3 until horizontally scanned 60° beyond bore sight and then climbs to about 1.5 at 75°. By comparing the uncompensated with the compensated performance, it may be seen that with the indiated compensating network, undegraded performance can be achieved to av ertical scanning angle of about 60°, and if a VSWR of 1.5 is tolerable, vertical scanning to about 75° may be employed.

Figure 2C:
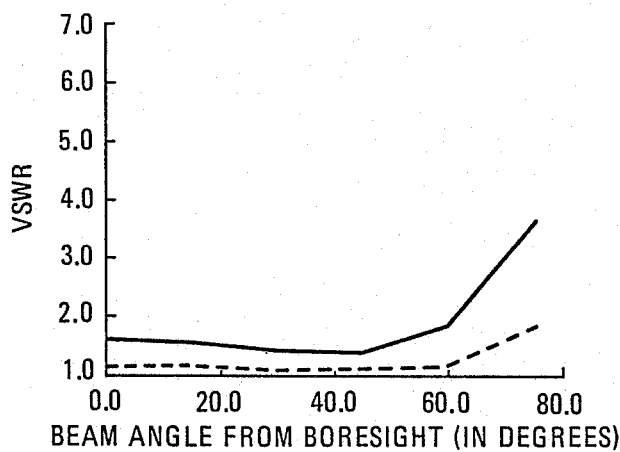

FIG. 2C graphs the VSWR of a steerable array as the angle of the horizontally scanned beam increases to 75° from bore sight under the conditions that the antenna is operated at 9.2 GHz. As before, the solid line depicts the VSWR of the steerable array without a matching network. The uncompensated VSWR remains relatively high, being about 1.6 at zero beam angle and decreasing to about 1.5 at 45° and then increases to 2 at 60°; increasing to 4 at 75°. With a matching network the performance depicted in the dashed lien is experienced. Through the range of from zero to 60° horizontal scanning, the VSWR remains at about 1.1 and increases to about 1.6 at 75°. From this it may be seen that the matching network very significantly improves performance not only at the higher scanning angles but throughout the horizontal scanning range.

Figure 2D:
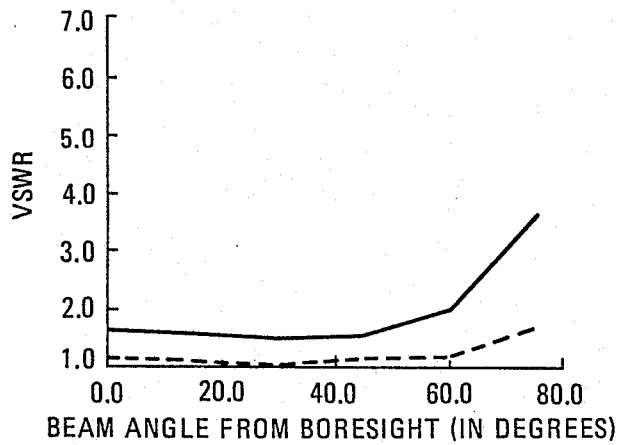

FIG. 2D graphs the VSWR of a steerable array as the beam is vertically scanned to 75° from bore sight. The conditions are as in FIG. 2C with the E-plane vertical, and the antenna operated at 9.2 GHz. Again it can be seen that the compensating network provides a verysignificant improvement throughout the depicted range of vertical steering angles.

Figure 2E:
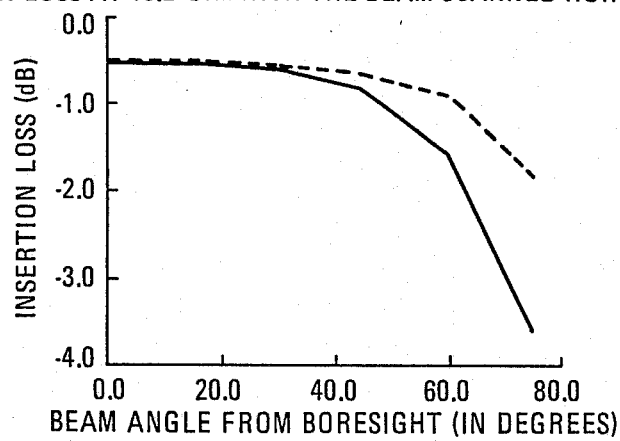
Figure 2F:
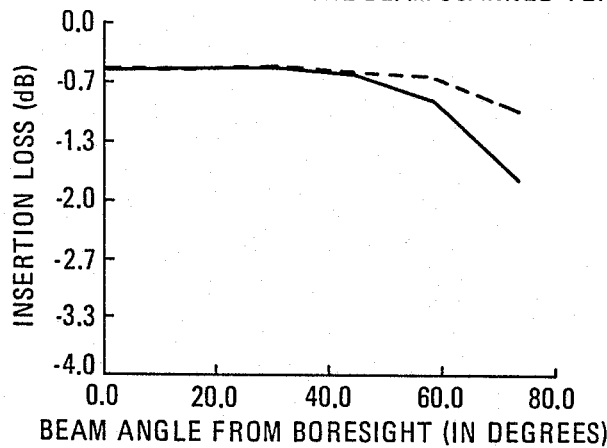
Figure 2G:
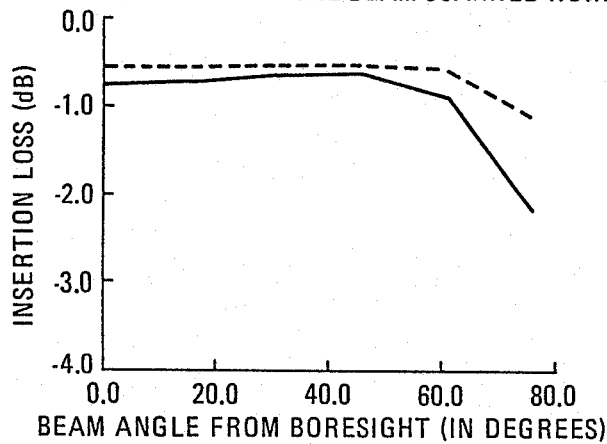
Figure 2H:
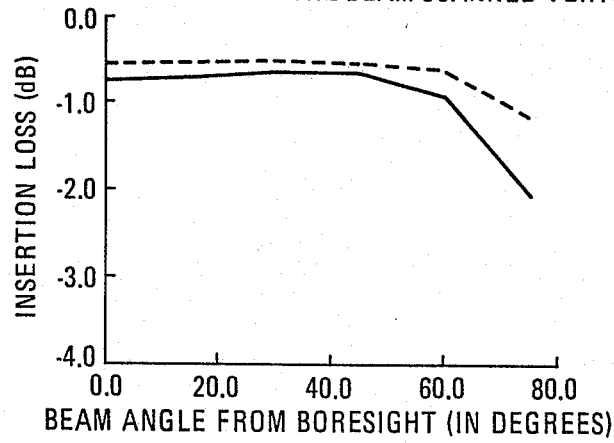

The graphs 2E–2H depict the insertion loss under comparable conditions to those for the earlier figures. However, the solid line now refers to the insertion loss of a conventional duplexer design using a circulator witha ½ db loss, while the dashed line continues to refer to the present duplexer. More particularly, FIG. 2E depicts the growing insertion loss at 10.2 GHz of a horizontally scanned beam, the E-plane being vertical. The insertion loss begins to increase substantially beyond a horizontal scnning angle of 30° and falls to about 3.5 db at 75°. With the matching network, the insertion loss is improved from about 30° horizontal scanning angle on to 75°, the greatest loss being approximately −1.8 db. FIG. 2F illustrates a comparable reduced insertion loss at larger steering angles when the beam is scanned vertically. With a matching network present, improvement is achieved starting at about 45° and continuing to 75° where the maximum attenuation is at about 1 db. FIGS. 2G and 2H illustrate the performance at 9.2 GHz. Under these conditions the solid line depicts an approximately −8/10 db insertion loss from bore sight which remains constant until high beam angles of scanning are encountered at which the loss increases rapidly to about −2.3 db. The curves for horizontal and vertical scanning are substantially the same. In both cases also an improvement of about 2/10th of a db are achieved from bore sight to about 40° after which the improvement increases to approximately 1 db. While the improvement in insertion loss is most marked at lage scanning angles, there is a definite improvement available by use of the invention when the antenna is used over a wide band of operating frequencies. The improvement in a typical case is on the order of ¼ to ½ db for one-way transmission or double that number when two-way transmission is involved.

The antenna system depicted in FIG. 1 is an application designed for operation over the frequency range of from 7 to 10 GHz. Typically, the antenna array 10 is formed froma large number ($\approx$3000) elements arranged in regular rows and columns. The individual dipole elements are fabricated by a printed circuit technique in which the dipole elements are formed by patterning a metallized layer supported upon an insulating substrate and the associated circuit. The baluns and duplexers associated with each dipole element, are designed for operation at these frequencies and are alike. The baluns and duplexers are designed in unbalanced microstrip with transmission being effected by finite width conductors supported upon an insulating substrate having a ground plane of theoretically infinite width on the other surface.

Figure 3:
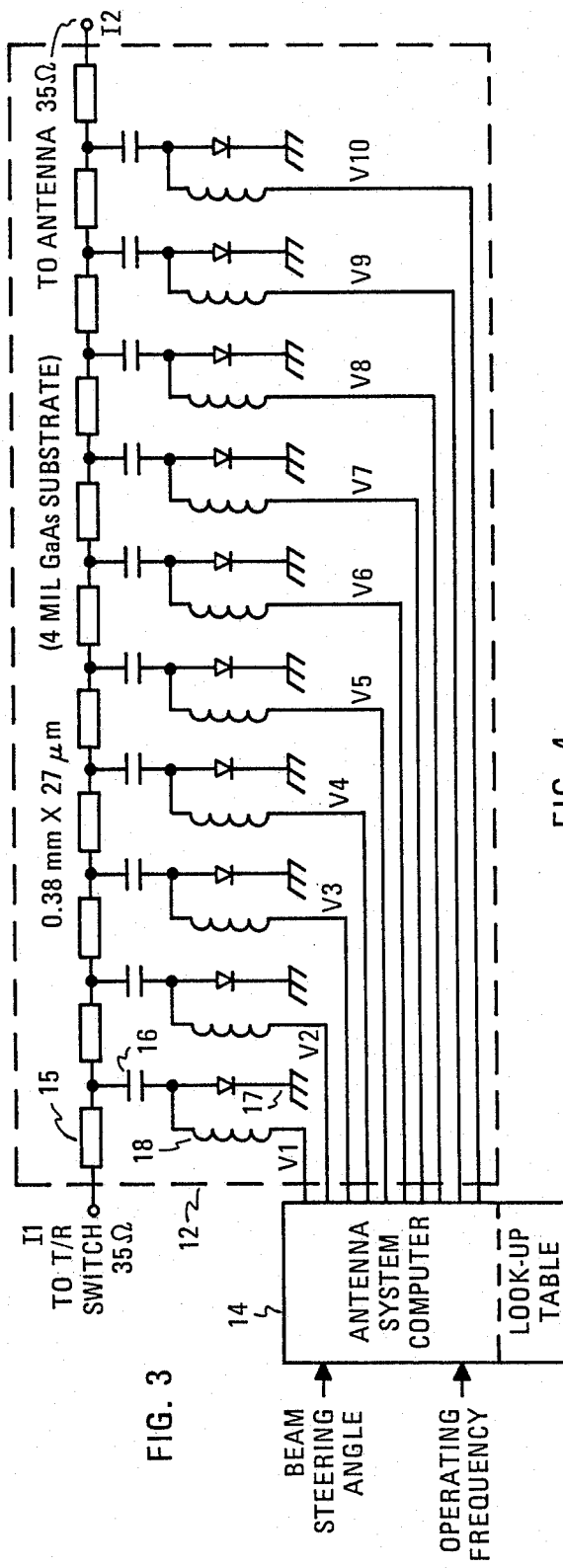
FIG. 3 is a circuit diagram of an electrically switchable matching network in accordance with a first embodiment of the invention, designed for use in each duplexer and a portion of the antenna system computer designed to set each matching network in the appropriate state for a given operating frequency and steering angle.

The duplexers each consist of a switchable matching network and a T/R device, FIG. 3 showing a circuit diagram of the switchable matching network 12 and the control means 14 for the matching network. The control means sets the matching network to minimize VSWR and attenuation loss in reception or transmission in accordance ith the beam steering angle and/or frequency.

The control means 14 is typically part of a larger antenna system computer not shown. The control means responds to the beam steering angle in a coordinate system suited to the application. Typically for a ground based application, this entails a "horizontal" steering anle and a "vertical" steering angle. Vertical is referenced to the E-planes of the individual elements of the array which may be vertical in relation to the earth.

The operating frequency is another input to the control means. The antenna elements in the case of dipole antennas are fabricated to given sizes, and thus have a resonant frequency to which the operating frequency may be referenced. In practice, however, the look up table is made specific to the antenna system in question. Thus, the settings of the matching network are computed for specific operating frequencies taking into account the antenna resonances and other variables.

The matching network 12 as seen in FIG. 3 is a transmission line having distributed and lumpted elements. It is designed to be coupled at one connection point to a T/R switch at a 35 ohm impedance and at the other connection point to an antenna also at a 35 ohm impedance. Should either connection be to a different impedance, one would add a suitable impedance transformer. The tranmission line is capable of bidirectional propagation permitting one connection point to be the source of signals and the other to be the signal load, or vice versa.

As seen in FIG. 3, the matching network 14 is further subdivided into ten similar filter sections (whose control connections are identified by the legends V1 to V10). Each filter section is susceptable of being in a state in which continuity is maintained in the transmission line or in a state in which a discontinuity is introduced as a result of the control setting.

Continuing, each filter section includes a series portion and a shunt portion. The series portion is a section of a distributed transmission line 15 typically of microstrip construction, of a higher characteristic impedance (e.g. 75 ohms) than the 35 ohm input and output impedances. The shunt portion consists of a reactance, specifically a capacitor 16, coupled to ground through a PI- diode 17. A control connection (V1–V10) is provided to the filter section from the antenna system computer 14. The control connection is provided as a binary dc level coupled via an RF choke 18 to the ungrounded anode terminal of the diode 17. The biasing dc levels are of suitable magnitudes to turn the diode off to anarbitrary state having small stable capacitance or on with a relatively small forward resistance. When diode 17 is biased off (the logical low state) and the shunt circuit becomes the equivalent of two mall capacitors in serires, and in effect a smaller equivalent capacitor. The smaller equivalent capacitor reactivelyloads the microstrip transmission line reducing the higher characteristic impedance of the transmission line section to 35 ohms, thus matching the section to the 35 ohm source or load at the external connections to the matching network. Should all the filter sections be in the "off" state, with all diodes non-conductive, the matching network would appear as a 35 ohm transmission line coupled between the external connections.

If, however, the diode 17 is biased on as a result of the control setting of computer 14 to the logical "high" state, the shunt portion of the filter section now exhibits a capacitive reactance in series with the relatively small forward resistance of the diode. The result is a lower impedance, higher capacitve reactance,than before and a mismatch is created in the propagation path. The mismatch reflects waves propagating toward the filter section.

In normal operation one, or two adjacent filter sections are turned on at the correct position in the matching network to offset the mismatch produced by the dipole antenna when steered off the bore sight position or when operated at other than the resonant frequency.

Figure 5:
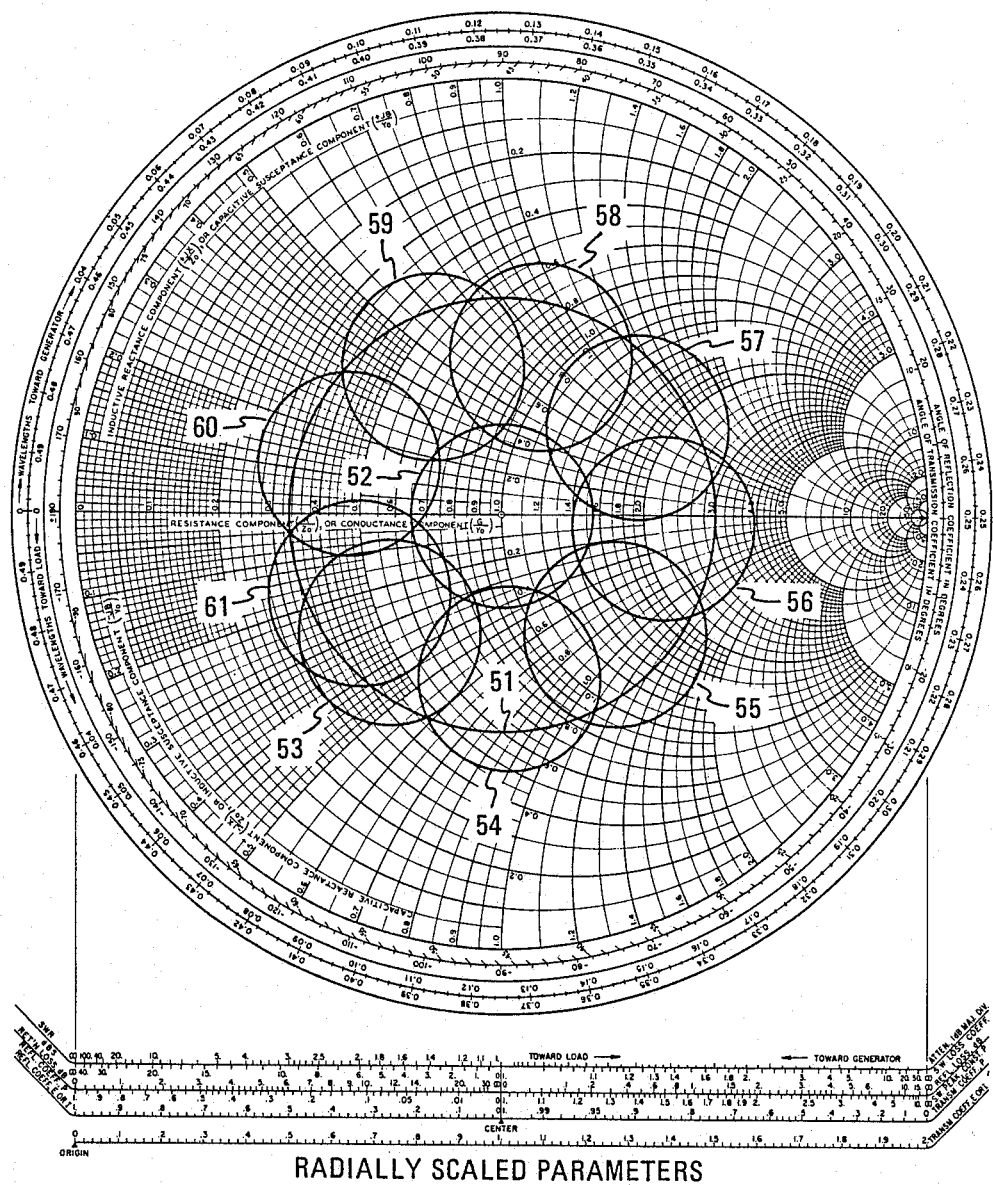
FIG. 5 is a Smith chart depicting the VSWR performance of the switchable matching network of the first embodiment as individual diode switches are switchedon.

While the matching operation may be best treated analytically by reference to the switch chart of FIG. 5, a briefer explanation of the matching flows from simple network theory. One should envision free space as a source having the desired purely resistive characteristic impedance. The antenna, however, due to steering or an offset operating frequency, exhibits a mismatch having real and imaginary arts. As the signal impinges on the antenna, a reflection is created and only the unreflected portion of the signal is transmitted to the receiver load resulting in a significant loss in efficiency. If, however, the matching network is adjusted such that the misturned antenna no longer feeds a matched resistive load, but rather feeds a reactive load adjusted by the introduction of a suitable reactive component to offset that of the antenna, the source feeds a matched load, and reflections are avoided.

The Smith chart of FIG. 5 illustrates the relationships somewhat more precisely. The smith chart depicts normalized complex impedances or admittances in polar coordinates. The printed lines of the chart include constant resistance or conductance circles, constant reactance or susceptance circles, and circles of constant standing wave ratios may be added by the user centered on the normalized resistance value of 1.0.

THe unmatched impedance of a typical antenna of the kind herein treated operating over preassigned frequency and steerig angle ranges has been found to exhibit a typical maximum VSWR of three. The VSWR of 3 is represented by the largest circle 51 in FIG. 5, centered at the resistance coordinate of 1.0 and passing through the resistance coordinate of 3.0.

The 3.0 VSWR circle 51 encloses an area containing the actual VSWR ranges of the unmatched antenna. When the antenna is steered to the bore sight and/or tuned to the resonant frequency, the VSWR will be very small approaching 1.0. As conditions change, a path, not illustrated, may be traced outward toward the unmatched 3.0 VSWR circle 51. If the antenna is horizontally or vertically scanned at the resonant frequency, the lines on the Smith chart, while originating at the origin proceed outwardly, but at different angular orientations. Should the antenna be operated at a different frequency, the angular positions also change. Thus compensation for the full 360° around the Smith chart may be desirable in the general case and quite efficient in particular cases. In applying the present matching, it is assumed that the antenna will be operated under conditions that will not allow the unmatched VSWR 3.0 to be exceeded.

The matching network, in accordance with the first embodiment of the invention, thus operates upon the general assumption that the impedance conditions may occur at any coordinate position within the 3.0 VSWR circle, and seeks to reduce the maximum VSWR to 1.6. The circle 52 represents a match VSWR of 1.6. It is centered on the resistance coordinate of 1.0, and passes through the resistnce coordinate of 1.6.

A circle (e.g. 53) similar in area to the desired inner 1.6 VSWR circle (52), is then displaced to an outward position where it embraces a substantial segment of the larger 3.0 VSWR circle (51). The impedance required to return the area of 53 to the center of the Smith chart determines the correction required for an antenna operating in that area of the chart. If the antenna shows an inductive reactance primarily, the correction required is a capacitive reactance. This impedance is generated by turning one of the diodes on. Since the circuit contains both serial and shunt elements,the center of the circle 53 lies neither on a constant resistance nor on a constant ractance line from the origin but in between. In the illustration, the center of circle 53 is on the 0.5 normalized resistance value, and on approximately the 0.35 normalized capacitive reactance line. This would thus permit compensation for a complimentary complex quantity presented by the entenna.

Should the complex impedance of the antenna not fall within the area of the circle 53, but outside of the 1.6 VSWR circle 52 then a delay is provided by a distributed transmission line element to insure that the correction caused by turning on an adjacent diode will occur in an adjacent region rotated counter-clockwise from the prior area on the Smith chart. The delays between shunt elements are normally equal, and set so that the complete perimeter of the 3.0 VSWR circle is embraced by the circles 53 and 61 at the lowest operating frequency. The circles must both fully embrace the perimeter of the 3.0 VSWR circle, and they must enclose the inner circle 52. In other words they must fully embrace the zone defined between the inner circle 52 and the outer circle 51.

The selection of the number of delay taps if chosen for midband, may require an upward revision to take into account the low end of the band if the band is widened substantially. Ordinarily additional sections similar in design to the others will be adequate.

In an exemplary embodiment for a 7-10 GHz application using a 35 ohm system impedance, the characteristic impedance of the distributed line is 75 ohms, and the delay at midband is about 20° per section. The capacitor 16 is 0.33 picofarads, the capacitance of the diode 17 when back biased is 0.2 picofarads with a serial resistance of ½ ohms. When conductive, the diode capacitance is negligible and the forward resistance is 1 ohm.

The control system for an antenna matching network is illustrated in FIG. 3. The antenna system computer receives input signals defining the horizontal and vertial beam steering angle and the operating frequency. A look up table is provided based on actual experience with the antenna array. The look up table thus indicates the amount of correction appropriate to each condition of operation. For small deflection angles, and near center frequency operation which take place within the 1.6 VSWR circle, no correction is indicated and all diodes in the switchable matching network are biased off. When the 1.6 VSWR circle is exceeded, the computer is programmed to turn on one or two adjacent diodes at the correct tap position to achieve the desired correction.

Figure 4:
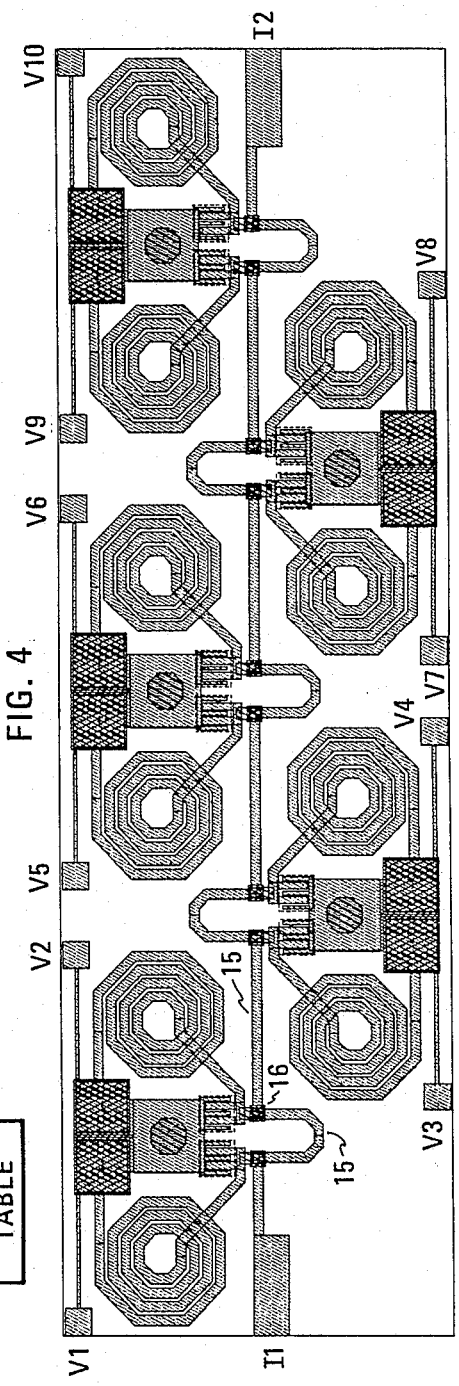
FIG. 4 is a plan view of a monolithically integrated circuit of the switchable matching network of the first embodiment.

A physical layout of the matching network shown in FIG. 3 is illustrated in FIG. 4. In transmission, the signal enters the chip at the pad to the left marked I1 and exits via the pad marked I2. In reception, the signal enters the pad I2. The pads V1 to V10 on the upper and lower edges of the chip are designed for connection to the antenna system computer. The distributed delay lines (15) consist of both "U" shaped and straight conductor runs providing equal delays. The capacitances 16 are the small black rectangles disposed at the transitions between "U" shaped and straight conductors (15). THe diodes 17 represent slightly larger square members in proximity to the plated through ground connection 19 (represented by a black circle set inside a larger shaded square). The control from the computer to the diodes leads through a large filter capacitor C1 (not shown on FIG. 3), which together with the choke 18 provides RF isolation between the external control pad V1 and the signal paths at the ungrounded diode terminals.

The dc potentials provided by the antenna system computer 14 to the diodes 17 are designed to maintain the diodes either in a reverse biased off state or in an on state. When in the off state, the reverse biasing is proportioned so that the diodes exhibit an accurately determined fixed capacitance. When the diodes are forwardly biased the bias current is adequate to reduce the forward resistance to a reasonably low and constant value in the vicinity of an ohm.

The arrangement as so far described, uses a minimum amount of power, and produces a minimum attenuation of the signal. Since only one or two diodes need be conductive at one time and the remainder are non-conductive, only these diodes draw significant current. In addition, due to the primarily reactive nature of the shunt elements, the signal is transmitted through the network with minimum dissipation. The measured value is normally less than one half db, a value which compares favorably with other systems.

Figure 6:
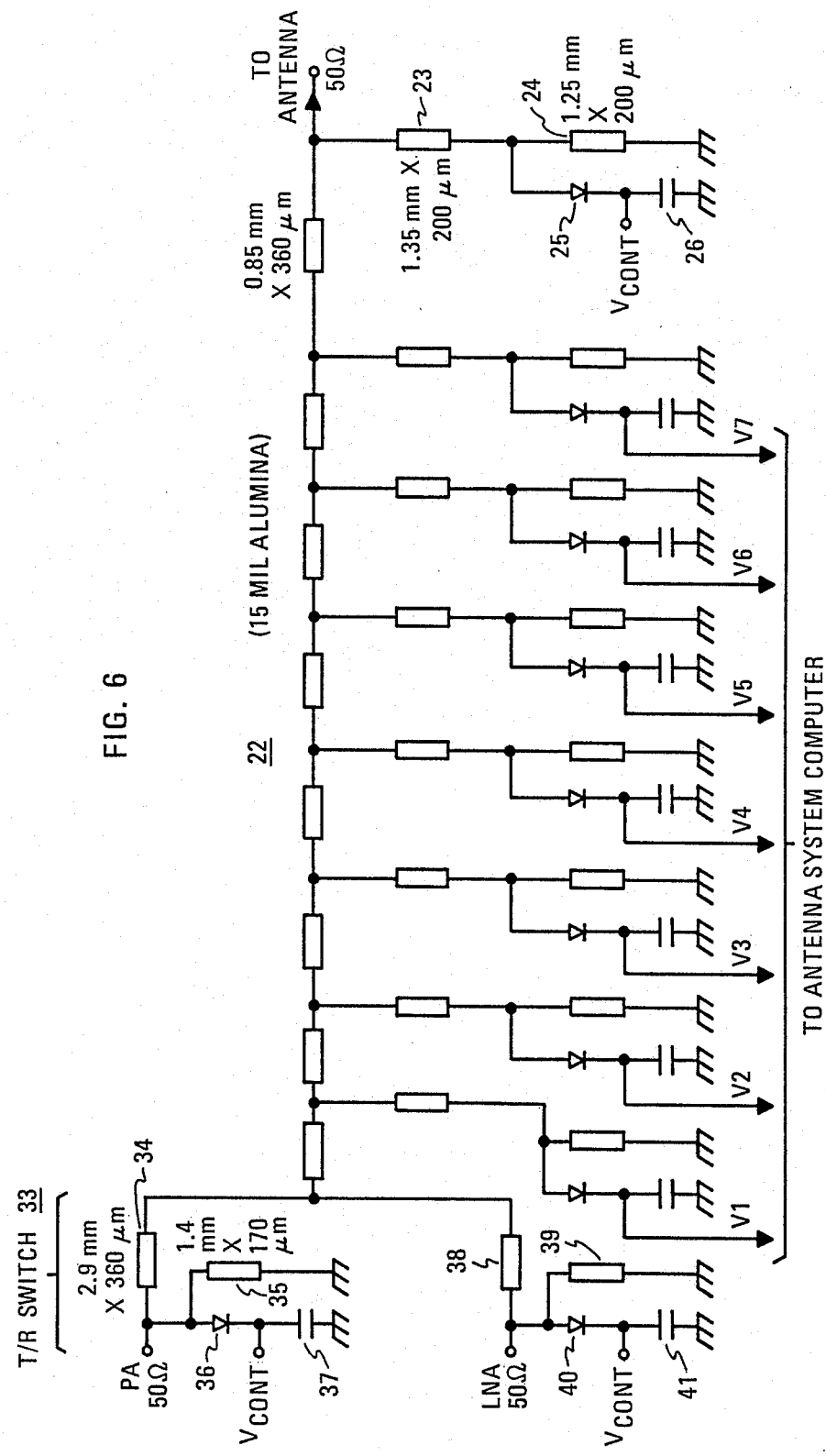
FIG. 6 is a circuit diagram of a duplexer in accordance with a second embodiment of the invention in which each transmission line element is formed of a serially connected length of distributed transmission line and a shunt connected pair of inductances, one of which is switched.

FIG. 6 is a circuit diagram of a second embodiment of the invention. The illustration is of a duplexer including both a switchable matching network 22 and a T/R device 33. The matching network 22 is in similar principle to that illustrated in FIG. 3 but is carried out using short transmission line sections in the shunt path which are equivalent to an inductance. More particularly, each shunt section comprises a section of microstrip 23 connected to ground through a second transmission line section 24. The diode is illustrated at 25, and the central connection is by-passed to ground through a capacitor 26. A representative series distributed line and the shunt element and their values are illustrated at the right most filter section.

The T/R device is of conventional design. The design is intended, however, to preclude any diversion of signal to the power amplifier when the low noise amplifier is on during reception and to preclude any diversion of power from the power amplifier to the low noise amplifier during transmission.

The T/R section connected with the power amplifier consists of a series segment 34 of the distributed transmission line and a shunt segment 35 of transmission line, the two segments having the indicated dimensions. A diode 36 serially connected with a by-pass capacitor 37 is connected in shunt with the transmission line element 35. The control voltage is applied to the cathode of the diode 36. When the diode 36 is conductive, a low impedance is presented and the PA terminal is virtually grounded for radio frequency signals.

The section of the T/R device connected to the low noise amplifier is of the same design as that connected to the power amplifier. It consists, as before, of a series transmission line segment 38, a shunt transmission line segment 39, and a diode 40 and by-pass capacitor 41, the elements 40 and 41 being serially connected in shunt with the transmission line segment 39. Control of the diode 40 is provided by the antenna system computer which enables the low noise amplifier to operate during reception and disables it during transmission by virtually grounding the LA terminal.

Figure 7:
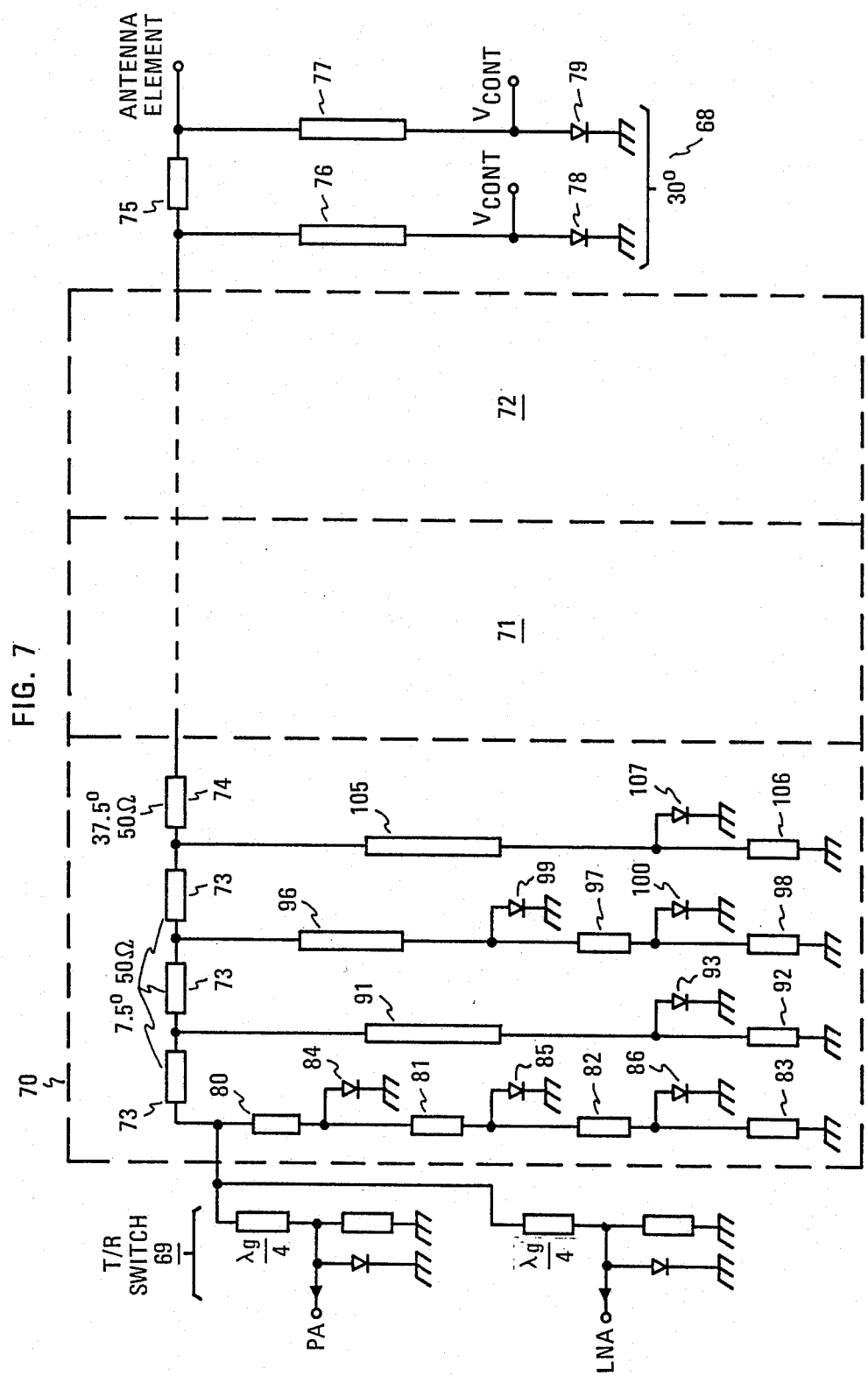
FIG. 7 is a circuit diagram of a duplexer in accordance with a third embodiment of the invention in which each transmission line element is formed of a serially connected length of distributed transmission line and a shunt connected plurality of inductances, all but one of which is switched, successive transmission line elements typically differing in numbers of shunt connected inductances.

The first and second embodiments are designed to bring about an improvement from a VSWR of about 3 to a VSWR of about 1.6. A higher degree of improvement may be achieved if the shunt elements are stepped to provide more than two intervening values and thus provide more than two switchable tranlations toward the center of the Smith chart. Such an arrangement is illustrated in FIG. 7. The arrangement in FIG. 7 may be used to reduce the maximum VSWR from 3.0 to about 1.22.

Figure 8:
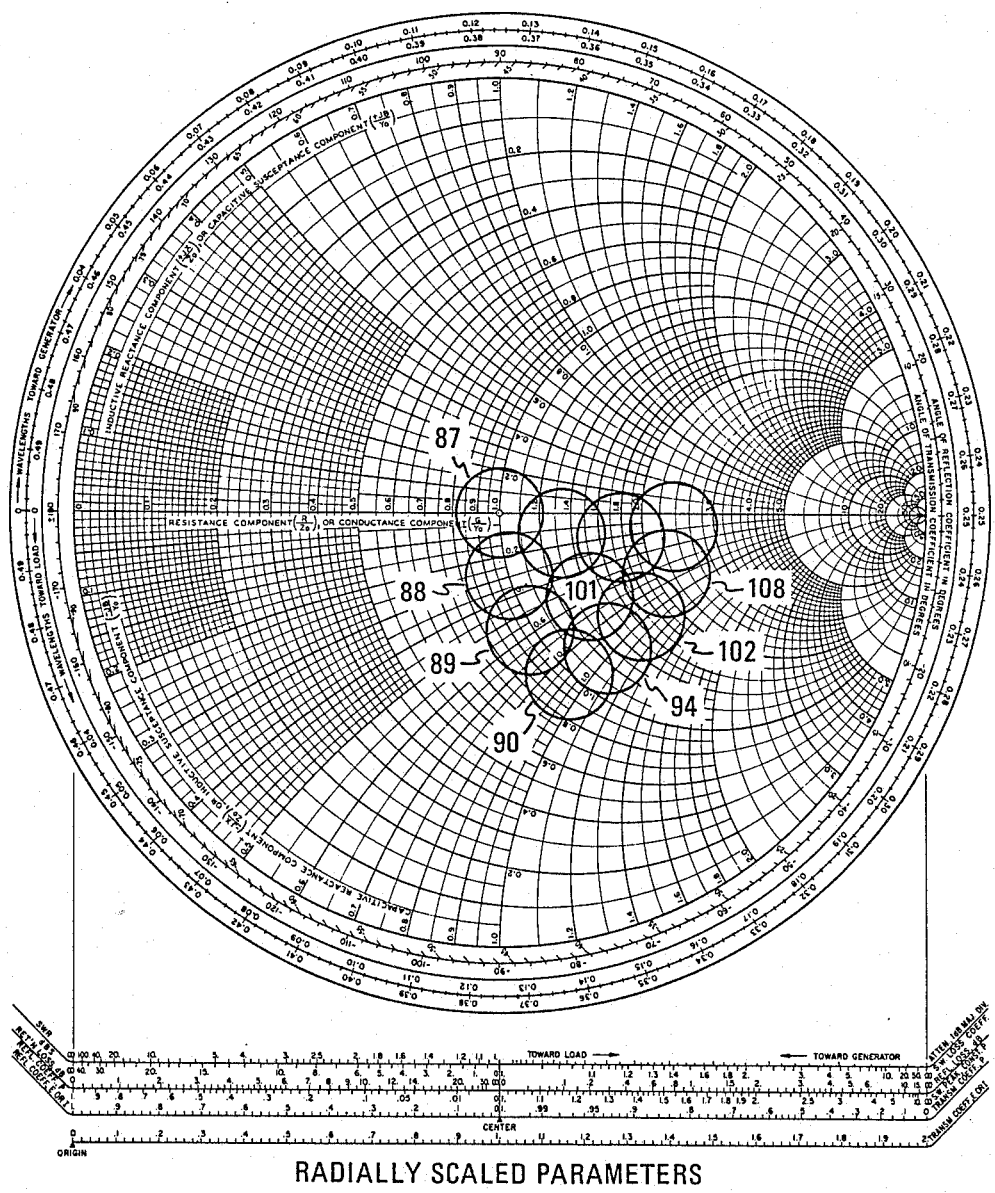
FIG. 8 is a Smith chart depicting the VSWR performance of the third embodiment.

FIG. 7 provides a circuit diagram of a switchable matching network in accordance with a third embodiment of the invention. In order to simplify this figure, the by-pass capacitors associated with each diode are not shown. FIG. 8, a Smith chart, illustrates the manner in which the electrical parameters of the circuit components of the third embodiment are selected to effect the desired reduction in the VSWR. The switchable matching network consists of three four branch sections 70, 71, 72, each section being identical and each providing 60° of angular coverage about the chart. Each of the three series elements (73) in each section provides a delay of 7.5° (at a design impedance of 50 ohms) and each set of three series elements is followed by a fourth series element 74 having a delay of 37.5°.

The mismatch from the antenna is compensated by reflecting a signal with the right magnitude and phase from one of the shunt structures so that it cancels the original mismatch. This reflected power travels twice through each of the series sections (73, 74) (one transit occurs in travelling from the antenna to the appropriate shunt structure and one transit occurs after reflection while travelling back to the antenna). This allows the 7.5° delays between shunt sections near that adjacent shunt sections to optimally match antenna impedances separated by 15° on the Smith chart. The four shunt structures within 70, 71, 72 thus provide coverage of a 60° sector of the Smith chart.

The 37.5° delay lines 74 cause these sectors to be separated by aproximately 60°. The resultant coverage resembles a three bladed fan. The three 60° gaps are covered by the final switchable delay, consisting of the elements (75-79). The delay (75-79) rotates the three covered regions by 60°, so as to cover the gaps and to provide a continuously covered area within the 3.0 VSWR circle.

The delay (75-79) consists of a series delay element 75 having shunt elements 76 and 77 at the end terminals thereof. The shunt elements are switched into and out of the circuit by means of the switching diodes 78 and 79. These diodes are controlled to be conductive simultaneously or non-conductive simultaneously to effect a 30° delay for one way transit. Full 360° of coverage is achieved by round trip operation which doubles the 30° delay to 60°, previously explained.

Filling in of the area of 3:0 VSWR circle in each of the three 60° sectors is provided by a carefully nested design of the four shunt paths. Each shunt path is connected to the left terminal of a series element (73, 74). The first shunt path consists of four serially connected distributed transmission line elements 80, 81, 82 and 83.

Each element in the shunt path consists of a short length of transmission line designed to provide an inductive impedance. The lower terminal of each shunt path element, except for the element (83) already grounded, is connected to ground via a diode (e.g. 84, 85, 86). Each diode, when conductive, provides a low resistance shunt to the elements connected nearer to ground in the shunt path. For example, when the diode 84 is conductive (the others off), the elements 81, 82 and 83 are shunted (and effectively out of the circuit), leaving only the element 80 to provide impedance in the first shunt path. When the diode 85 is conductive (the others off), the shunt path elements 82 and 83 are shunted (and inoperative) with the shunt path elements 80 and 81 remaining in the first shunt path. When the diode 86 is conductive, the shunt path element 83 is shunted (and inoperative), leaving the shunt path elements 80, 81 and 82 in the shunt path. When none of the diodes (84, 85 or 86) are conductive, all four of the shunt path elements 80-83 contribute to the shunt impedance in the first path. The circuit is controlled such that only one diode or no diodes are conductive at one time.

Thus, depending on which diode, if any, is conductive, one of four possible impedance values are present in the shunt path,and four circles representing covered areas are available on lines extending approximately radially along approximately constant reactance lines from the center of the Smith chart. These circles are respectively 87, 88 89, and 90. The inner circle 87 represents the compensation when no diode is conductive, (and all shunt elements 80-83 are effective).

The shunt elements 80-83 and the diodes 84-86 are selected so that when no diode is conductive the impedance presented to the serial line 73 is very high. This centers the circle 87 approximately on the center of the Smith chart. The circle 88 represents the compensation when diode 86 is conductive. The circle 89 represents the compensation when diode 85 is conductive, and the circle 90 represents the compensation when diode 84 is conductive.

The remaining three shunt paths are similarly designed, and complete the nested coverage of the 60° sector of the Smith chart. The second shunt path in the network consists of a pair of shunt elements 91, 92 and a single diode 93 providing two possible values for the second shunt path, and provides for the two covered circular areas 87 and 94. The third shunt path consists of the shunt path elements 96, 97, and 98 and the diodes 99, 100. The third shunt path provides three possible shunt values and the three covered circular areas 87, 101, and 102. The fourth and last shunt path provides two shunt elements 105 and 106 and a single diode 107. The shunt path provides coverage of circular areas 87 and 108. The final series delay element 74 has a delay of 37.5° which sets the conditions for coverage of the next 60° sector of the Smith chart.

As illustrated in FIG. 8, the circles that are formed on the Smith chart for one 60° sector are each of a radius appropriate to a VSWR of 1.22. The circles overlap each other in such a way that the total area within the 60° sector of the 3.0 VSWR circle of the Smith chart is matched.

The FIG. 7 switchable matching network is completed by three repetitions 70, 71, and 72 of the four branch network followed by the final switchable delay 75-79, which is connected at the antenna end of the matching network. The T/R switch is provided at the PA, LA end of the matching network. the T/R switch is of similar design to those provided in the earlier figures.

A fourth embodiment of the invention is a counterpart of the third embodiment using capacitors instead of short lengths of transmission lines in the shunt paths. Its operation and single elements of the matching network are illustrated in FIGS. 9(a)-9(h). In the arrangement of FIG. 3, a single branch entailing two states is achieved with a capacitor in series with a PI diode. When the diode is non-conductive, the shunt path has two serially connected capacitors forming a small capacity of relatively high impedance. When the diode is conductive, the shunt path is equivalent to one larger and therefore relatively lower impedance capacitor. In a path exhibiting up to four states as in certain elements of the fourth embodiment, two parallel connected capacitors are provided. Each is connected in series with a PIN diode. This permits one to achieve four capacitance values at that shunt path and permits slightly greater bandwidths than with the inductive version of the matching network. An arrangement using capacitors rather than transmission line inductances is also generally cheaper and of lower loss.

The first and fourth embodiments both use PIN diodes and capacitors as shunt path impedances. Both the PIN diodes and the capacitors are tailored to optimize the design parameters as will be explained by resort to FIGS. 9(a)-9(h).

Figure 9A:
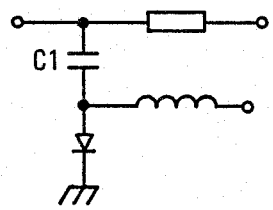
FIG. 9(a) to 9(h) are views of a transmission line element in which the series path elements are lengths of distributed transmission lines, and the shunt path elements are capacitors.
Figure 9B:
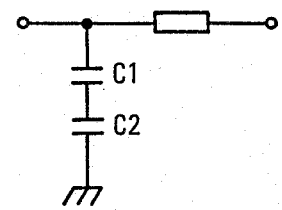

FIG. 9(a) shows one element of the matching network that could be used in either the first or fourth embodiments. FIG. 9(b) shows the approximate equivalent circuit when the diode is reversely biased. The resultant effective shunt capacitance $C_3$ is given by the well known formula:

$$C_3 = \frac{C_1 C_2}{C_1 + C_2} \quad (1)$$

$C_1$ and $C_2$ must be selected so that the resultant capacitance $C_3$ gives the required effective impedance for the artificial transmission line consisting of the series lines (15) and the capacitances $C_3$.

Figure 9C:
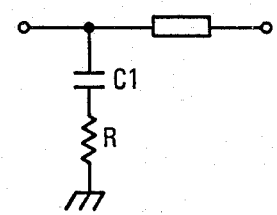

FIG. 9(c) shows the approximate equivalent circuit when the diode is forwarded biased. The diode resistance R is very small compared to the impedance of $C_1$ at the operating frequency. The center of the impedance circle which can be compensated by turning the diode on is set by the extra capacitance added to the line. That is to say $C_1-C_3$. In the design, $C_1$ and $C_2$ must also be selected so that $C_1-C_3$ gives the required value.

Figure 9D:
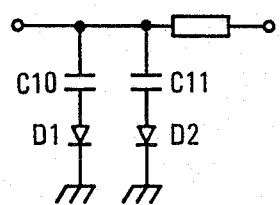
Figure 9E:
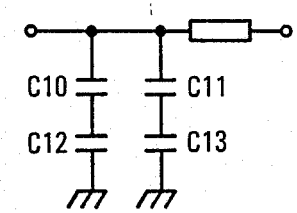
Figure 9F:
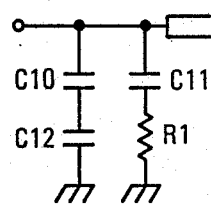
Figure 9G:
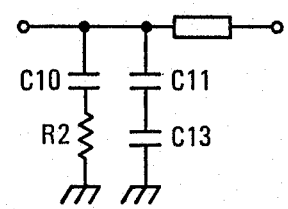
Figure 9H:
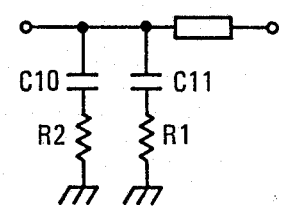

The optimization of the parameters of the capacitors and PIN diodes of the fourth embodiment is similar. FIG. 9(d) shows one element of the matching network to be used in the fourth embodiment. This element incorporates two diodes and two capacitors. Because each diode can be biased into one of two states a total of four possible states are possible. These are shown in FIG. 9(e), (f), (g), (h).

When both diodes are reverse biased the effective resultant capacitance is $$C_{20} = \frac{C_{10} C_{12}}{C_{10} + C_{12}} + \frac{C_{11} C_{13}}{C_{11} + C_{13}} \quad (2)$$

When diode $D_1$ is forward biased the resultant capacitance loading the line is $$C_{21} = C_{10} + \frac{C_{11} C_{13}}{C_{11} + C_{13}} \quad (3)$$

When diode $D_2$ is forward biased the resultant capacitance loading the line is $$C_{22} = \frac{C_{10} C_{12}}{C_{10} + C_{12}} + C_{11} \quad (4)$$

When diodes $D_1$ and $D_2$ are both forward biased, the resultant capacitance loading the line is $C_{23} = C_{10} + C_{11}$. The element values $C_{10}$, $C_{11}$, $C_{12}$, $C_{13}$ must be selected so as to satisfy the following conditions:

(1) $C_{20}$ loads the series transmission line section, so that the resultant artificial transmission line has the required impedance.

(2) $(C_{21}-C_{20})$, $(C_{22}-C_{20})$ and $(C_{23}-C_{20})$ set the centers of the three regions that can be perfectly matched by this element. These three circles are analogous to circles 88, 89, 90 of FIG. 8, which refers to embodiment 3. The element values must be selected so that these circles are optimally positioned to cover the required area of the Smith chart. A graphical solution normally provides adequate accuracy.

The foregoing embodiments are designed to provide matching over a full VSWR circular area. The design approach is of particular advantage for broadband and wide steering angle applications. The principles of the invention are equally applicable to operation over a narrower frequency band or for less extensive steering angles. In such cases, the matching network may be simplified.

The matching network herein described is introduced because the antenna has reflective losses. An ideal matching networks would provide a loss less match and eliminate the reflective losses. However, ideal networks do not exist, and realizable matching networks may be expected to add dissipative loss while reducing reflective loss. The matching networks herein described also add dc power consumption, due to conduction by the PIN diode switches used in the shunt paths. The illustrated configuration are accordingly designed such that a minimum number of diodes are on in any given state. In the FIG. 3 embodiment for instance, only one or two diodes are conductive in any given state. This is also true in the FIG. 6 embodiment. In the FIG. 7 embodiment only one diode is on in any shunt path, and normally only one of the 12 shunt paths have one active diode. Thus the dc consumption in the networks herein described due to diode conduction is minimized. When the configurations employ capacitors instead of inductors, the conductive losses are normally smaller as well.

The matching network with the associated T/R switches thus provides a very low loss solution to the problem of driving a steered array by plural power amplifiers and of using that array to feed a plurality of low noise amplifiers.

What is claimed is:
1. In an antenna system, the combination comprising;
   (a) an electronically steerable array comprising an n-fold plurality of like antenna elements, each antenna element exhibiting a given purely resistive impedance at a given frequency and beam steering angle, said parameters of frequency and beam steering angle jointly and severally affecting said impedance,

(b) an n-fold plurality of like, switchable matching networks, each matching network being serially connected between an antenna utilization device such as a transmitter element, a receiver element, or both at one connection point and a corresponding antenna element at the other connection point and providing a bidirectional transmission path between said connection points, and each network comprising a plurality of serially connected transmission line elements with a serial and a shunt portion and having a characteristic impedance matched to said given impedance, successive transmission line elements producing a delay which accumulates stepwise as a function of serial position in said matching network;

the shunt portion of each transmission line element comprising a switchable reactance element, which in one state preserves said characteristic impedance, and in the other state introduces a reactive mismatch comparable to that introduced by said antenna element when at least one of said parameters varies, and (c) control means set in accordance with at least one of said parameters for switching one reactance element to said other state in a selected ($i^{th}$) transmission line element in each of said n-fold switchable matching networks to produce a reactive mismatch at a phase shift selected to offset said antenna mismatch and transform said antenna impedance to a value approximating said given impedance in each element of said steerable array.

2. The combination set forth in claim 1 wherein
each serial portion of a transmission line element is a length of distributed transmission line and
each shunt portion of a transmission line element is a capacitor connected in series with a diode switch, which in a non-conductive state preserves said characteristic impedance and in a conductive state introduces a reactive mismatch.

3. The combination set forth in claim 1 wherein
each serial portion of a transmission line element is a length of distributed transmission line and
each shunt portion of a transmission line element comprises a first circuit comprising a first capacitor conected in series with a first diode switch, and a second circuit comprising a second capacitor larger than said first capacitor connected in series with a second diode switch, said two circuits being connected in parallel, whereby when both diodes are in the non-conductive state the characteristic impedance is preserved, and when one or the other or both diodes are in the conductive state, successively larger reactive off-setting mismatches are provided to avoid exceeding an acceptable VSWR.

4. The combination set forth in claim 1 wherein
each serial portion of a transmission line element is a length of distributed transmission line and
each shunt portion of a transmission line element is a pair of inductances connected in series and a diode switch connected in shunt with one inductance, said diode when in a non-conductive state preserving said characteristic impedance and in conductive state introducing a reactive mismatch.

5. The combination set forth in claim 5 wherein
said inductances are formed of lengths of distributed transmission lines.

6. The combination set forth in claim 1 wherein
each serial portion of a transmission line element is a length of distributed transmission line and each shunt portion of a transmission line element consists of a first plurality of inductances connected in a grounded series circuit and a second plurality of diode switches, one less than said first plurality, which are connected in a grounded shunt circuit, respectively with one inductance, two inductances, etc. to (m−1) inductances whereby when all diodes are non-conductive, the characteristic impedance is preserved, and when one diode is conductive depending on the number of inductances shunted to ground, a stepped increase in the offsetting reactive mismatch is provided.

7. The combination set forth in claim 7 wherein
said inductances are formed of lengths of distributed transmission lines.

8. A switchable matching network for providing a bidirectional transmission path between an antenna utilization device, such as a transmitter element, a receiver element, or both at one connection point and a corresponding antenna element at the other connection point at a given characteristic impedance; said network comprising a plurality of serially connected transmission line elements and having a serial and a shunt portion and having a characteristic impedance matched to said given impedance, successive transmission line elements producing a delay which accumulates stepwise as a function of serial position in said matching network;

the shunt portion of each transmission line element comprising a switchable reactance element, which in one state preserves said characteristic impedance, and in the other state introduces a reactive mismatch comparable to that introduced by said antenna element when at least one of the parameters of frequency and beam steering angle is varied, and control means set in accordance with said parameters for switching one reactance element to said other state to produce a reactive mismatch at a phase shift selected to offset said antenna mismatch and transform said antenna impedance to a value approximating said given impedance in said element.

9. The matching network set forth in claim 9 wherein
each serial portion of a transmission line element is a length of distributed transmission line and
each shunt portion of a transmission line element is a capacitor connected in series with a diode switch, which in a non-conductive state preserves said characteristic impedance and in a conductive state introduces a reactive mismatch.

10. The matching network set forth in claim 9 wherein
each serial portion of a transmission line element is a length of distributed transmission line and
each shunt portion of a transmission line element comprises a first circuit comprising a first capacitor connected in series with a first diode switch, and a second circuit comprising a second capacitor large than said first capacitor connected in series with a second diode switch, said two circuits being connected in parallel, whereby when both diodes are in the non-conductive state the characteristic impedance is preserved, and when one or the other or both diodes are in the conductive state, successively larger reactive off-setting mismatches are provided to avoid exceeding an acceptable VSWR.

11. The matching network set forth in claim 9 wherein each serial portion of a transmission line element is a length of distributed transmission line and each shunt portion of a transmission line element is a pair of inductances connected in series and a diode switch connected in shunt with one inductance, said diode when in a non-conductive state preserving said characteristic impedance and in a conductive state introducing a reactive mismatch.

12. The matching network set forth in claim 13 wherein said inductances are formed of lengths of distributed transmission lines.

13. The matching network set forth in claim 9 wherein each serial portion of a transmission line element is a length of distributed transmission line and each shunt portion of a transmission line element consists of a first plurality of inductances connected in a grounded series circuit and a second plurality of diode switches, one less than said first plurality, which are connected in a grounded shunt circuit, respectively with one inductance, two inductances, etc. to $(m-1)$ inductances whereby when all diodes are non-conductive, the characteristic impedance is preserved, and when one diode is conductive depending on the number of inductances shunted to ground, a stepped increase in the offsetting reactive mismatch is provided

* * * * *